(12) United States Patent
Hirota

(10) Patent No.: US 7,965,065 B2
(45) Date of Patent: Jun. 21, 2011

(54) TRIMMING CIRCUIT

(75) Inventor: Akihiro Hirota, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 507 days.

(21) Appl. No.: 12/174,028

(22) Filed: Jul. 16, 2008

(65) Prior Publication Data

US 2009/0072804 A1 Mar. 19, 2009

(30) Foreign Application Priority Data

Sep. 14, 2007 (JP) ................................. 2007-239851

(51) Int. Cl.
G05F 1/652 (2006.01)
(52) U.S. Cl. ......................... 323/233; 323/297; 323/354
(58) Field of Classification Search .................. 323/233, 323/297, 354
See application file for complete search history.

(56) References Cited

U.S. PATENT DOCUMENTS

| 5,818,210 A * | 10/1998 | Ueno ............................. 323/297 |
| 6,498,469 B2 * | 12/2002 | Kobayashi ..................... 323/313 |
| 6,744,244 B2 * | 6/2004 | Liu et al. ....................... 323/354 |
| 6,771,053 B2 * | 8/2004 | Stanescu et al. ............... 323/298 |
| 7,019,585 B1 * | 3/2006 | Wilson et al. ................. 327/541 |
| 7,071,669 B2 * | 7/2006 | Morita .......................... 323/297 |
| 2003/0111992 A1 * | 6/2003 | Nazarian et al. ............... 323/354 |
| 2009/0243726 A1 * | 10/2009 | Kojima ......................... 330/282 |

FOREIGN PATENT DOCUMENTS

| JP | 03172906 | 7/1991 |
| JP | 04-356816 A | 12/1992 |
| JP | 07-141041 | 6/1995 |
| JP | 2002-271145 A | 9/2002 |
| JP | 2003-223153 A | 8/2003 |
| JP | 2007-148530 A | 6/2007 |

OTHER PUBLICATIONS

Japanese Office Action "Notice of Reason for Rejection" with mailing date of Aug. 11, 2009; Japanese Patent Application No. 2007-239851 with English Translation.

* cited by examiner

*Primary Examiner* — Jeffrey L Sterrett
(74) *Attorney, Agent, or Firm* — Studebaker & Brackett PC; Donald R. Studebaker

(57) ABSTRACT

A trimming circuit which comprises a shunt circuit having two shunt resistors and two shunt ON/OFF switches and connected in parallel with a series resistor circuit. The middle point of the shunt circuit is connected to a connection point of the series resistor circuit, the resistance ratio thereof with respect to the connection point being equal to the resistance ratio of the shunt resistors.

11 Claims, 6 Drawing Sheets

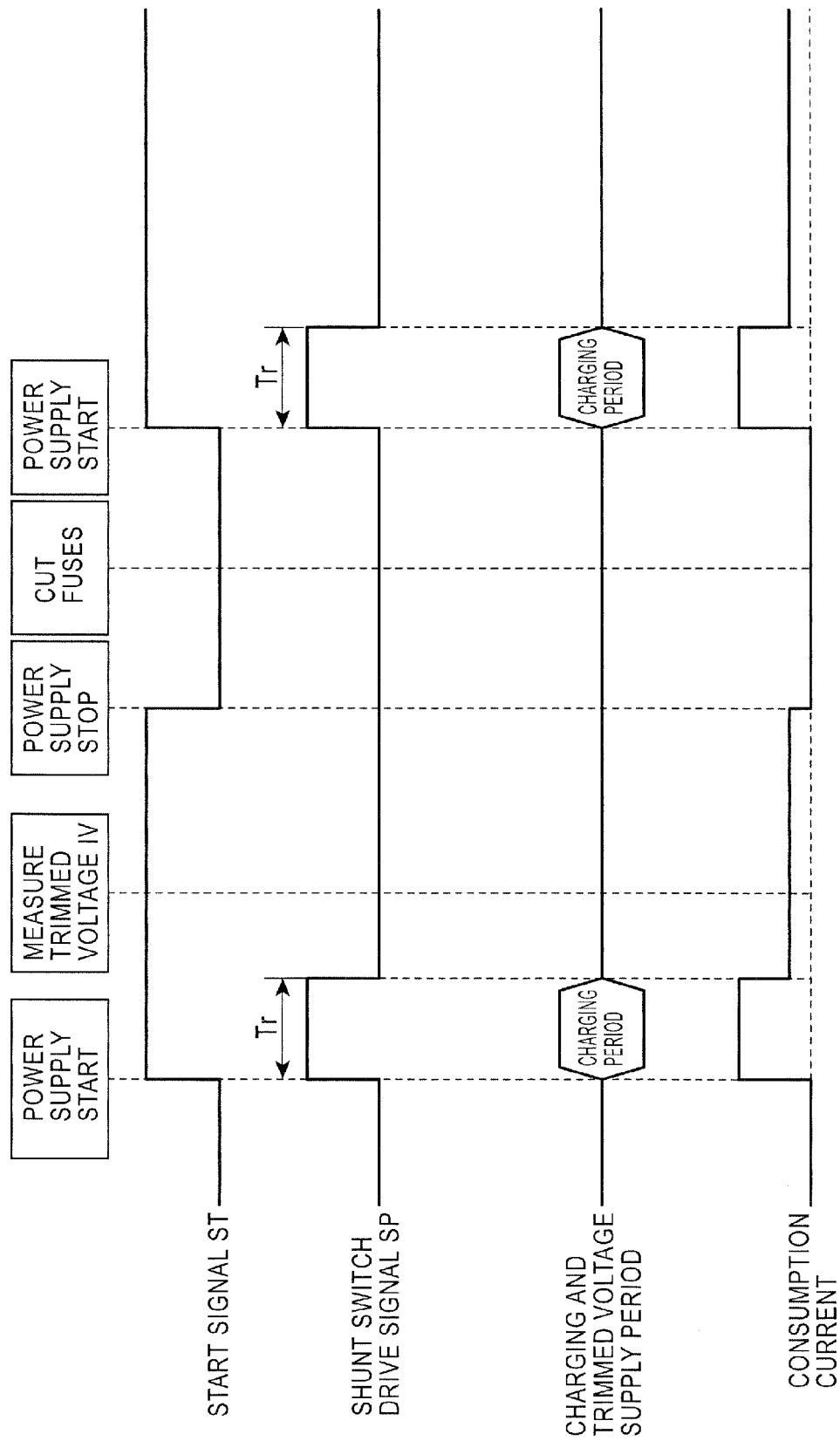

TRIMMING CIRCUIT

BACKGROUND OF THE INVENTION

1. Field of the Invention

The present invention relates to a trimming circuit that supplies a trimmed voltage according to an external voltage supplied.

2. Description of the Related Art

Since many years ago, a trimmed voltage generated by a trimming circuit has been used to drive semiconductor devices without using an externally supplied power supply voltage as it is, thereby preventing decrease in withstand voltage of transistors and reducing noise and power consumption.

However, with conventional trimming circuits provided in semiconductor devices, the trimmed voltage that is supplied to memory varies due to production variations in the manufacturing process, and hence there is the problem that the trimmed voltage differs for each semiconductor device.

In Japanese Patent Application Laid-Open Publication Kokai No. H03-172906 (hereinafter, also referred to as Patent document 1), an example of a trimming circuit that can solve the above problem is disclosed.

In the Patent document 1, a trimming circuit is disclosed which comprises a series resistor circuit comprising trimming resistors serially connected between the output of a differential amplifier and ground potential, ON/OFF switches connected between the connection points of those resistors and one input terminal of the differential amplifier, a fuse ROM for determining an ON/OFF switch to be driven, and a decoder for supplying a drive signal to the ON/OFF switch based on input signals from the fuse ROM.

The trimming circuit described in the Patent document 1 drives one of the ON/OFF switches ON with use of the drive signal generated based on signals from the fuse ROM, thereby changing a feedback ratio of the series resistor circuit, and thus the trimmed voltage can be set at a desired voltage value.

However, because the series resistor circuit and the differential amplifier have line resistance and line or gate capacitance added thereto, these capacitances need to be charged in a time from the drive start of the ON/OFF switch. The time for the charging causes the problem that the generation or setup of a comparison voltage that is inputted to the one input terminal of the differential amplifier via the series resistor circuit and the ON/OFF switch is delayed.

To solve the above problem, when the resistance of the series resistor circuit is reduced so as to speed up the charging to prevent the generation delay of the comparison voltage, the problem will occur that the steady-state current flowing through the series resistor circuit increases resulting in an increase in consumption current.

SUMMARY OF THE INVENTION

The present invention was made in view of the above mentioned problem, and an object thereof is to provide a trimming circuit that can prevent the generation or setup delay of the comparison voltage with preventing the consumption current of the trimming circuit from increasing.

In order to solve the above problem, according to the present invention, there is provided a trimming circuit which trims a supplied external voltage to supply the trimmed voltage via a supply line, comprising a differential amplifier having a reference voltage inputted to one input terminal thereof and generating the trimmed voltage from the external voltage to output onto the supply line; a series resistor circuit having a plurality of trimming resistors connected serially via a plurality of their connection points between the supply line and ground potential; a plurality of ON/OFF switches provided respectively in between the connection points and the other input terminal of the differential amplifier; and a shunt circuit having a shunt series resistor circuit of two shunt resistors serially connected via a middle point and two shunt ON/OFF switches respectively connected to opposite ends of the shunt series resistor circuit, the shunt circuit being connected in parallel with the series resistor circuit. The middle point is connected to one of the connection points of the series resistor circuit, the resistance ratio thereof with respect to the one of the connection points being equal to the resistance ratio of the shunt resistors.

The trimming circuit may further comprise a controller to drive the shunt ON/OFF switches ON/OFF according to an instruction.

The resistance of each the trimming resistor may be greater than the resistance of each the shunt resistor.

The instruction may be a one-shot pulse signal, and when receiving the one-shot pulse signal, the controller may drive the shunt ON/OFF switches ON/OFF.

Further, there is provided a trimming circuit which trims a supplied external voltage to supply the trimmed voltage via a supply line, comprising a differential amplifier having a reference voltage inputted to one input terminal thereof and generating the trimmed voltage from the external voltage to output onto the supply line; a series resistor circuit having first and second resistor groups of a plurality of resistors connected serially, the first and second resistor groups being serially connected between the supply line and ground potential; a switch group of a plurality of ON/OFF switches connected between a predetermined number of connection points of the plurality of resistors of the first and second resistor groups and the other input terminal of the differential amplifier; a first shunt circuit having a first shunt switch and a first shunt resistor serially connected, the first shunt circuit being connected in parallel with the first resistor group; and a second shunt circuit having a second shunt switch and a second shunt resistor serially connected, the second shunt circuit being connected in parallel with the second resistor group. One ends of the first resistor group, the second resistor group, the first shunt circuit, and the second shunt circuit are connected in common.

A combined resistance of the first resistor group may be higher than the resistance of the first shunt resistor.

In the trimming circuit of the present invention, a shunt circuit having two shunt resistors and two shunt ON/OFF switches and connected in parallel with a series resistor circuit is provided. The middle point of the shunt circuit is connected to a connection point of the series resistor circuit, the resistance ratio thereof with respect to the connection point being equal to the resistance ratio of the shunt resistors. Hence, the generation delay of the comparison voltage can be prevented with preventing the consumption current of the trimming circuit from increasing.

BRIEF DESCRIPTION OF THE DRAWINGS

FIG. 6 is a time chart of the trimming circuit of FIG. 3.

DETAILED DESCRIPTION OF THE INVENTION

An embodiment according to the present invention will be described in detail below with reference to the drawings.

Figure 1:
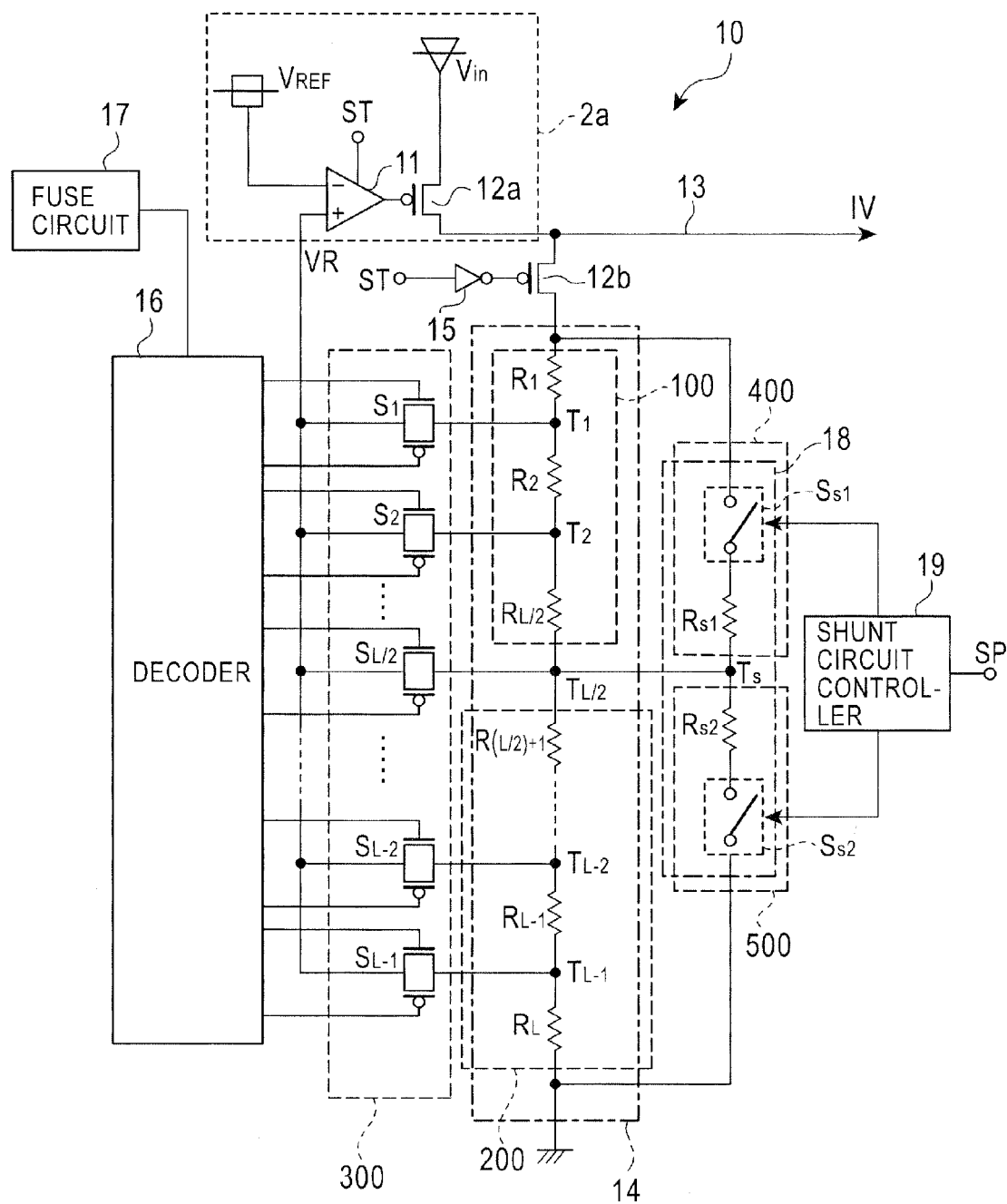
FIG. 1 is a circuit diagram of a trimming circuit capable of trimming in L−1 steps according to an embodiment of the present invention.

FIG. 1 shows the circuit configuration of a trimming circuit capable of trimming in L−1 steps, where L is an arbitrary positive even number, according to an embodiment of the present invention.

As shown in FIG. 1, the trimming circuit 10 comprises a differential amplifier 11 having a reference voltage source $V_{REF}$ connected to its negative input terminal. The output terminal of the differential amplifier 11 is connected to a P-type MOS transistor 12a. Further, a start signal ST indicating a start of its operation is input to the differential amplifier 11. The start signal ST may be generated by a start signal generator (not shown) when electric power of a predetermined level is supplied to a semiconductor device provided with the trimming circuit of the present invention. One end of the P-type MOS transistor 12a is connected to an external power supply $V_{in}$, and the other end thereof is connected to a supply line 13 of a trimmed voltage IV to an internal device such as a semiconductor memory (not shown). Hence, when the differential amplifier 11 is not in operation, the external power supply voltage is applied to the supply line 13. Note that the destination for the supply line 13 to be connected to is not limited to a semiconductor memory but may be an internal device that needs a more stable trimmed voltage IV without using an external power supply voltage from an external power source.

The supply line 13 is connected via a P-type MOS transistor 12b to one end of a series resistor circuit 14 consisting of L trimming resistors $R_1$ to $R_L$ serially connected, where L is an arbitrary positive even number, and the other end (on the trimming resistor $R_L$ side) opposite to the one end (on the trimming resistor $R_1$ side) is connected to ground potential. The trimming resistors $R_1$ to $R_{L/2}$ are referred to as a first resistor group 100, and the trimming resistors $R_{(L/2)+1}$ to $R_L$ are referred to as a second resistor group 200. The start signal ST inverted by an inverter 15 is input to the P-type MOS transistor 12b. When the start signal ST is input to the trimming circuit 10, trimming starts.

Connection points $T_1$ to $T_{L-1}$ of the trimming resistors $R_1$ to $R_L$ are connected to one ends of ON/OFF switches $S_1$ to $S_{L-1}$, and the other ends of the ON/OFF switches $S_1$ to $S_{L-1}$ are connected to a positive input terminal of the differential amplifier 11. Further, the ON/OFF switches $S_1$ to $S_{L-1}$ are connected at their gates to a decoder 16. Only one of the ON/OFF switches $S_1$ to $S_{L-1}$ that corresponds to a switch drive signal generated by the decoder 16 according to a fuse data signal from a fuse circuit 17 is driven. The ON/OFF switches $S_1$ to $S_{L-1}$ are, for example, P-N paired transfer gates or may be other switch devices any one of which can be put in an ON state. The ON/OFF switches $S_1$ to $S_{L-1}$ are referred to as a switch group 300.

Let $r_1$ be the resistance of the trimming resistor $R_1$, $r_2$ be the resistance of the trimming resistor $R_L$, and $r_3$ be the resistance of the other trimming resistors $R_2$ to $R_{L-1}$. The resistances $r_1$, $r_2$ are desirably set at such values that a voltage close to a desired trimmed voltage IV is obtained when the ON/OFF switch $S_{L/2}$ connected to the middle point (i.e., connection point $T_{L/2}$) of the series resistor circuit 14 is turned on. This is because that setting of the resistances $r_1$, $r_2$ enables the voltage IV to be trimmed sufficiently in both negative and positive directions.

Further, the series resistor circuit 14 is connected at its opposite ends in parallel with a shunt circuit 18. The shunt circuit 18 comprises a shunt series resistor circuit of shunt resistors $R_{S1}$, $R_{S2}$ serially connected via a middle point $T_S$. The shunt circuit 18 further comprises shunt ON/OFF switches $S_{S1}$, $S_{S2}$ connected to the opposite ends of the series of the shunt resistors $R_{S1}$, $R_{S2}$ respectively. A circuit consisting of the shunt resistor $R_{S1}$ and the shunt ON/OFF switch $S_{S1}$ is referred to as a first shunt circuit 400, and a circuit consisting of the shunt resistor $R_{S2}$ and the shunt ON/OFF switch $S_{S2}$ is referred to as a second shunt circuit 500. A shunt circuit controller 19 is connected to the shunt ON/OFF switches $S_{S1}$, $S_{S2}$. The shunt circuit controller 19 simultaneously turns the shunt ON/OFF switches $S_{S1}$, $S_{S2}$ ON only for a predetermined time according to a shunt switch drive signal SP generated based on the start signal ST. For example, the shunt circuit controller 19 may control the shunt circuit 18 according to a one-shot pulse generated using the start signal ST as a trigger. The shunt switch drive signal SP may be generated by the above-mentioned start signal generator (not shown).

The middle point $T_S$ of the shunt circuit 18 is connected to the one of the connection points $T_1$ to $T_{L-1}$ of the series resistor circuit 14 with respect to which the resistance ratio thereof is equal to the ratio of shunt resistor $R_{S1}$ to shunt resistor $R_{S2}$. Because in FIG. 1 the middle point $T_S$ is connected to the connection point $T_{L/2}$, the ratio of shunt resistor $R_{S1}$ to shunt resistor $R_{S2}$ and the resistance ratio for the trimming resistors $R_1$ to $R_L$ are expressed by the equation (1), letting $r_{S1}$, $r_{S2}$ be the resistances of shunt resistors $R_{S1}$, $R_{S2}$ respectively:

$$r_{s1} : r_{s2} = r_1 + \frac{L-2}{2} \times r_3 : r_2 + \frac{L-2}{2} \times r_3 \quad (1)$$

By satisfying the equation (1), when the shunt ON/OFF switches $S_{S1}$, $S_{S2}$ switch from an ON state to an OFF state, a comparison voltage VR that is input to the positive input terminal of the differential amplifier 11 does not vary.

With the above configuration, when the shunt ON/OFF switches $S_{S1}$, $S_{S2}$ switch from the OFF state to the ON state, the shunt resistor $R_{S1}$ becomes connected in parallel with the series circuit of the trimming resistors $R_1$ to $R_{L/2}$, and thus the resistance from the supply line 13 to the ON/OFF switch in the ON state is decreased. When only the ON/OFF switch $S_{L/2}$, for example, is in the ON state, that resistance $r_a$ is expressed by the equation (2):

$$r_a = r_1 + \frac{L-2}{2} \times r_3 \quad (2)$$

In contrast, when the ON/OFF switch $S_{L/2}$ and the shunt ON/OFF switches $S_{S1}$, $S_{S2}$ are ON, that resistance $r_b$ is expressed by the equation (3):

$$r_b = \frac{r_{s1} \times \left(r_1 + \frac{L-2}{2} \times r_3\right)}{r_1 + \frac{L-2}{2} \times r_3 + r_{s1}} \quad (3)$$

Here, where the equation (4) is satisfied, that is, the resistance of the shunt resistor $R_{S1}$ is one tenth of the combined resistance of the trimming resistors $R_1$ to $R_{L/2}$, when the shunt ON/OFF switches $S_{S1}$, $S_{S2}$ are turned on, the resistance from the supply line 13 to the ON/OFF switch in the ON state is one eleventh of the combined resistance.

$$r_{s1} = \frac{r_1 + \frac{L-2}{2} \times r_3}{10} \quad (4)$$

Thus, during the predetermined time that the shunt ON/OFF switches $S_{S1}$, $S_{S2}$ are ON, capacitances such as the resistor capacitance and the gate capacitance can be charged 11 times faster than in the OFF state.

In the case where L is a positive odd number, the middle point $T_S$ of the shunt circuit 18 is connected to near the middle point of the series resistor circuit 14 (i.e., connection point $T_{(L/2)\pm 0.5}$), and as in the case where L is a positive even number, the resistance from the supply line 13 to the ON/OFF switch in the ON state is reduced during the predetermined time that the shunt ON/OFF switches $S_{S1}$, $S_{S2}$ are ON.

Figure 2:
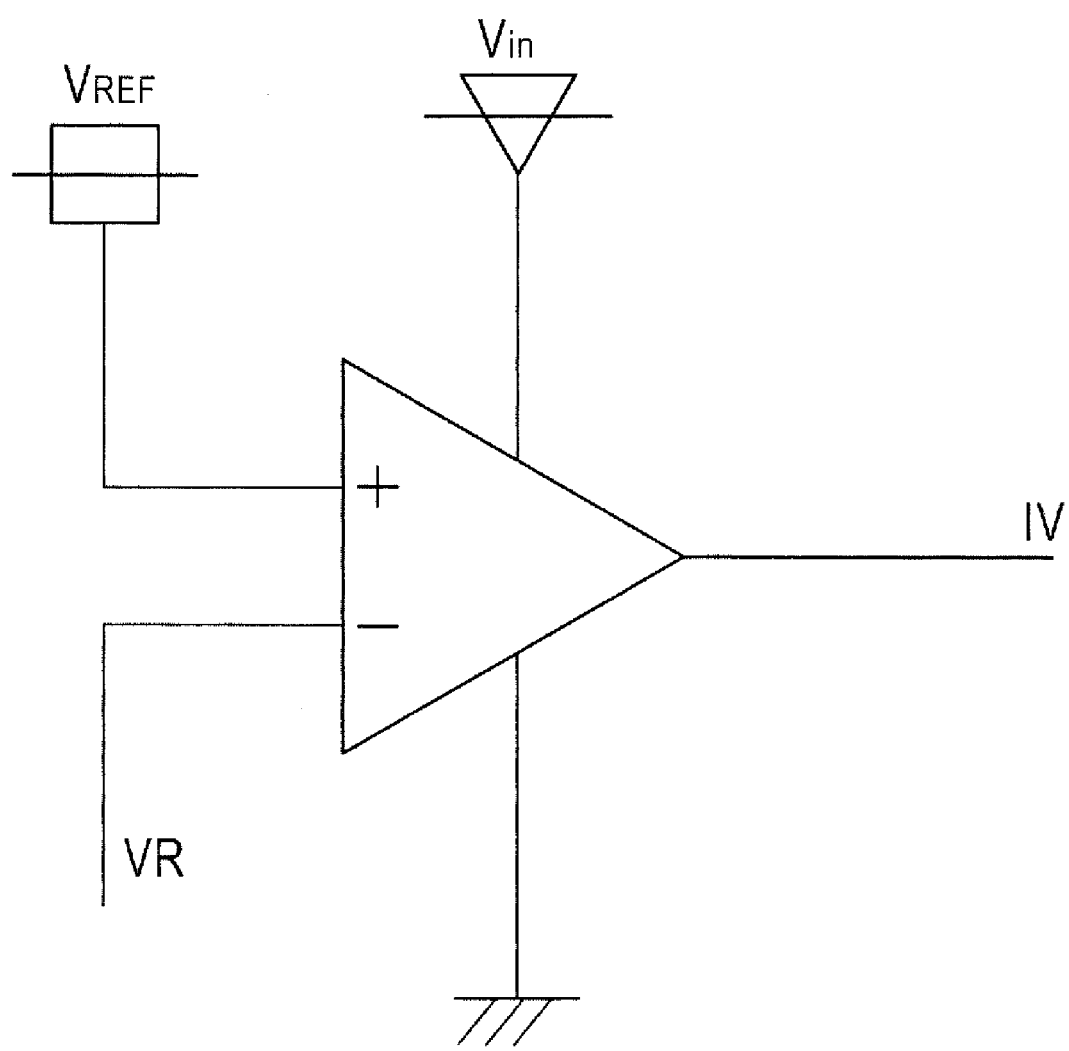
FIG. 2 is a circuit diagram of another example of a differential amplifier in the embodiment of the present invention.

Note that as to the part enclosed by the broken line 2a, the differential amplifier 11 may be connected as illustrated in FIG. 2. As shown in FIG. 2, the reference voltage source $V_{REF}$ is connected to the positive input terminal of the differential amplifier 11, and the switch group 300 is connected to the negative input terminal of the differential amplifier 11. Further, the external power supply $V_{in}$ and ground potential are connected to the power supply terminals of the differential amplifier 11. The output of the differential amplifier 11 is connected directly to the supply line 13 not via the P-type MOS transistor 12a.

Figure 3:
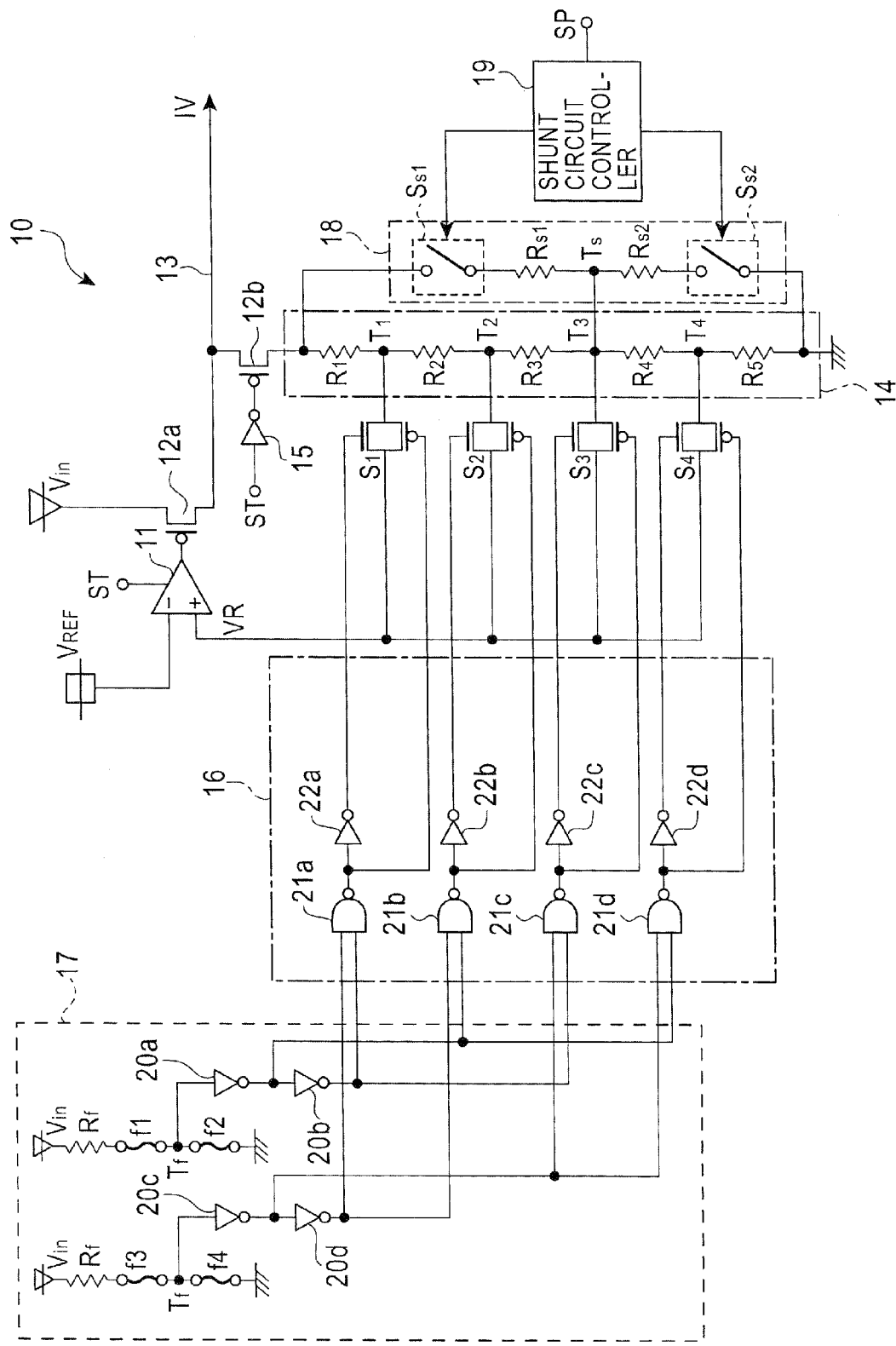
FIG. 3 is a circuit diagram of a trimming circuit capable of trimming in four steps according to an embodiment of the present invention.

FIG. 3 shows a circuit configuration of a trimming circuit capable of trimming in four steps. First, the parts more specific than in FIG. 1 will be described. The same or equivalent elements as in FIG. 1 are denoted by the same reference numerals with description thereof being omitted.

As shown in FIG. 3, the fuse circuit 17 comprises fuses f1 to f4. The fuses f1, f2 are serially connected via the middle point $T_f$. The fuse f1 is connected via a resistor $R_f$ to the external power supply $V_{in}$, and the fuse f2 is connected to ground potential. The middle point $T_f$ of the fuses f1, f2 is connected to an inverter 20a, which is connected to an inverter 20b. The fuses f3, f4 are also connected to the external power supply $V_{in}$, ground potential, and inverters 20c, 20d in the same way as for the fuses f1, f2. Although not shown, the power supply to the inverters 20a to 20d is the external power supply $V_{in}$.

The decoder 16 comprises NAND gates 21a to 21d connected to the inverters 20a to 20d. To be specific, the NAND gate 21a is connected to the inverters 20b, 20d; the NAND gate 21b is connected to the inverters 20a, 20d; the NAND gate 21c is connected to the inverters 20b, 20c; and the NAND gate 21d is connected to the inverters 20a, 20c. The NAND gates 21a to 21d connect to inverters 22a to 22d respectively. Further, the NAND gates 21a to 21d and the inverters 22a to 22d connect to ON/OFF switches $S_1$ to $S_4$ respectively. To be specific, the NAND gate 21a and the inverter 22a connect to the ON/OFF switch $S_1$; the NAND gate 21b and the inverter 22b connect to the ON/OFF switch $S_2$; the NAND gate 21c and the inverter 22c connect to the ON/OFF switch $S_3$; and the NAND gate 21d and the inverter 22d connect to the ON/OFF switch $S_4$.

In the above configuration, before some of the fuses f1 to f4 are cut (i.e., before trimming), the ON/OFF switch $S_4$ is always in an ON state. By cutting one of each pair of fuses f1 to f4, one of the ON/OFF switches $S_1$ to $S_4$ becomes in the ON state.

Figure 4:
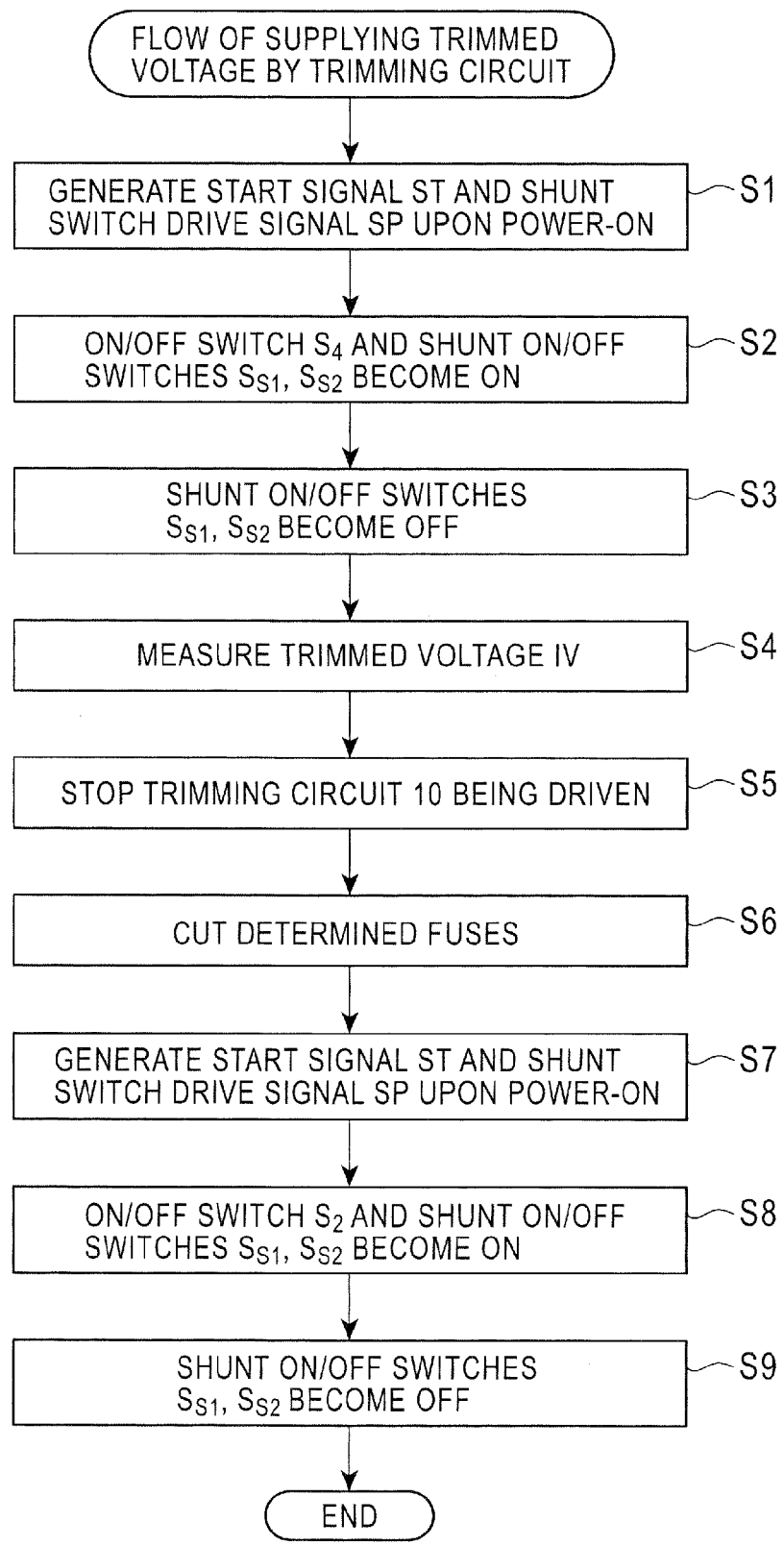
FIG. 4 is a flow chart showing the operation of supplying a trimmed voltage by the trimming circuit of FIG. 3.

Next, the operation of the trimming circuit 10 of FIG. 3 until starting to supply a desired trimmed voltage IV will be described with reference to the flow chart of FIG. 4.

Predetermined electric power is supplied to a semiconductor device comprising the trimming circuit 10 of the present invention, and thereby the start signal ST and the shunt switch drive signal SP in response to the start signal ST are generated (step S1). The trimming circuit 10 starts operating in response to the start signal ST. One ON/OFF switch corresponding to the switch drive signal generated according to the fuse data signal becomes ON, and the shunt ON/OFF switches $S_{S1}$, $S_{S2}$ become ON in response to the shunt switch drive signal SP (step S2). Here, since none of the fuses is cut, the ON/OFF switch $S_4$ becomes ON, and thus the comparison voltage VR is input to the differential amplifier 11, so that the trimmed voltage IV is generated. After a predetermined time has elapsed, the shunt ON/OFF switches $S_{S1}$, $S_{S2}$ become OFF (step S3).

Then an operator measures the trimmed voltage IV with a tester (step S4). Thereafter the supply of the electric power to the semiconductor device is stopped so that the trimming circuit 10 stops being driven (step S5). From the measuring result, the fuses to be cut to obtain the desired trimmed voltage IV are determined and cut (step S6).

Figure 5:
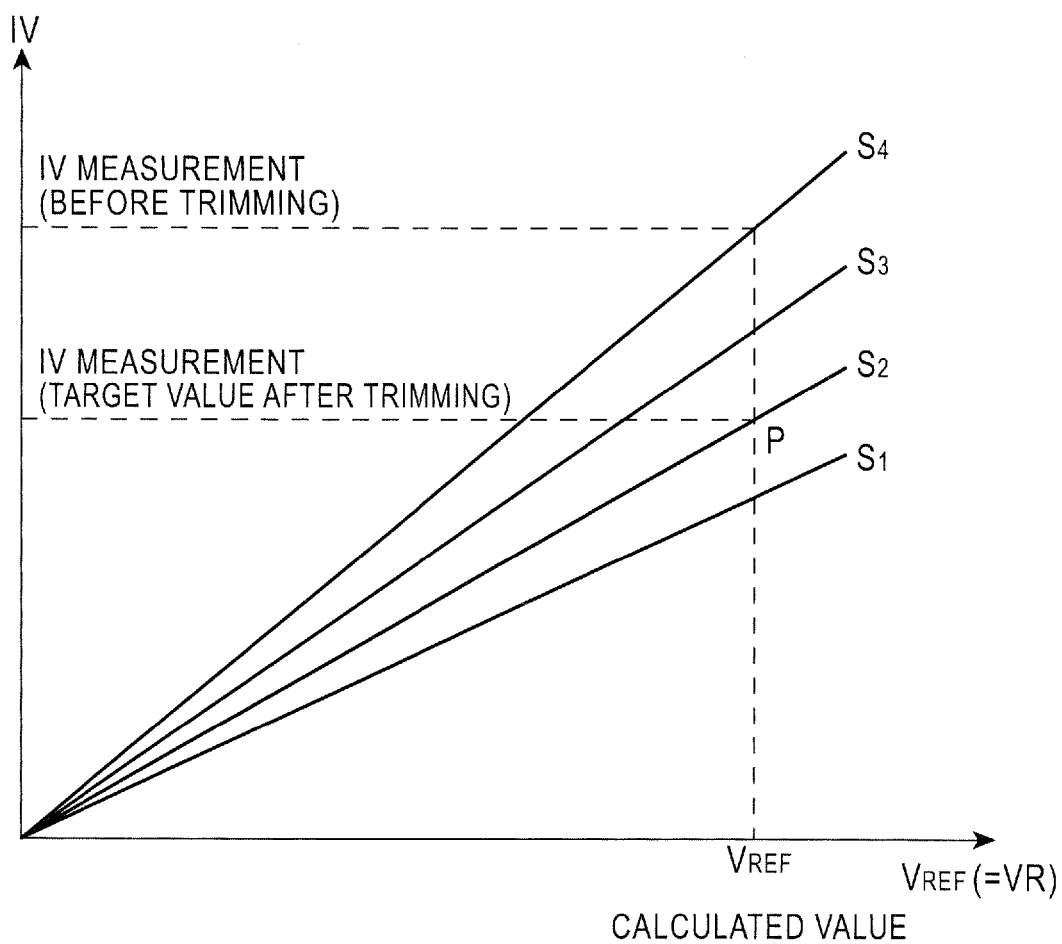
FIG. 5 shows a relationship between a trimmed voltage IV and a reference voltage $V_{REF}$ for each ON/OFF switch.

The method of determining the fuses to be cut for, e.g., the case where measuring results and calculating results as shown in FIG. 5 have been obtained. As shown in FIG. 5, the horizontal axis of the graph represents the reference voltage $V_{REF}$ or the comparison voltage VR, and the vertical axis of the graph represents the trimmed voltage IV. A relationship between a calculated reference voltage $V_{REF}$ corresponding to the measurement obtained by measuring the trimmed voltage IV at step S4 and the measurement of the trimmed voltage IV is denoted as a straight line $S_4$. Relationships between the trimmed voltage IV and the reference voltage $V_{REF}$ which have been calculated for the cases where another ON/OFF switch is ON using the straight line $S_4$ as a reference are denoted as straight lines $S_1$, $S_2$, $S_3$. The desired trimmed voltage to be supplied to the internal device is decided in advance, and hence fuses are cut such that the ON/OFF switch (switch $S_2$ for the case of FIG. 5) corresponding to the straight line (line $S_2$ in FIG. 5) passing through the point P specified by the desired trimmed voltage and the calculated reference voltage $V_{REF}$ becomes ON. In order to turn, e.g., the ON/OFF switch $S_2$ ON, the fuses f1 and f4 are cut. The flow chart will continue to be described below for the case where the fuses f1 and f4 have been cut.

Again the predetermined electric power is supplied to the semiconductor device, and thereby the start signal ST and the shunt switch drive signal SP in response to the start signal ST are generated (step S7). The trimming circuit 10 starts operating in response to the start signal ST. The ON/OFF switch $S_2$ corresponding to the switch drive signal generated according to the fuse data signal of the value corresponding to the fuses f1 and f4 being cut becomes ON, and the shunt ON/OFF switches $S_{S1}$, $S_{S2}$ become ON in response to the shunt switch drive signal SP (step S8). Since the ON/OFF switch $S_2$ becomes ON, the comparison voltage VR is input to the differential amplifier 11, so that the desired trimmed voltage IV is generated. After a predetermined time has elapsed, the shunt ON/OFF switches $S_{S1}$, $S_{S2}$ become OFF (step S9). Even when the shunt ON/OFF switches $S_{S1}$, $S_{S2}$ become OFF, the trimmed voltage IV does not vary, and the desired trimmed voltage IV continues to be supplied to the internal device such as a semiconductor memory.

The generation of the start signal ST and of the shunt switch drive signal SP and changes in the state of the trimming circuit 10 shown in FIG. 4 and changes in consumption current will be described with reference to FIG. 6.

As shown in FIG. 6, in response to the start of supplying the predetermined electric power to the semiconductor device, the start signal generator generates the start signal ST, and the shunt switch drive signal SP, i.e., a one-shot pulse having a pulse width Tr is generated in response to the start signal ST. The pulse width Tr of the one-shot pulse is the time during which capacitances such as resistor capacitance and gate capacitance are charged. After the predetermined time (i.e., the pulse width Tr) has elapsed, the capacitances need not be charged. The consumption current starts flowing at the start of the charging period. During the charging period the consumption current does not vary, and at the same time that the charging period ends, the consumption current starts decreasing. While the trimming circuit 10 is in operation, the consumption current is lower than during the charging period. After the predetermined time (i.e., the pulse width Tr) has elapsed, the trimmed voltage IV is measured. Thereafter the supply of the electric power to the semiconductor device is stopped, and fuses are cut. While the supply of the electric power to the semiconductor device is stopped, the trimming circuit 10 does not operate, and hence the consumption current does not occur.

Also, when the predetermined electric power is again supplied to the semiconductor device, the start signal ST and the shunt switch drive signal SP are generated as before cutting fuses, and the consumption current increases and decreases. The predetermined time (i.e., the pulse width Tr) is the time during which capacitances such as resistor capacitance and gate capacitance are charged. The consumption currents before and after cutting fuses may be different depending on which ON/OFF switch is ON.

As described above, according to the trimming circuit of the present embodiment, the shunt circuit consisting of the two shunt resistors and the two shunt ON/OFF switches that is connected in parallel with the series resistor circuit is provided, and the connection point of the series resistor circuit with respect to which its resistance ratio is equal to the resistance ratio of the shunt resistors is connected to the middle point of the shunt circuit. By this means, the resistance from the supply line to the differential amplifier is reduced only during the predetermined time, and hence the generation or setup delay of the comparison voltage can be prevented with preventing the consumption current of the trimming circuit from increasing.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2007-239851 which is hereby incorporated by reference.

What is claimed is:

1. A trimming circuit which trims a supplied external voltage to supply a trimmed voltage via a supply line, comprising:
a differential amplifier having a reference voltage inputted to one input terminal thereof and generating said trimmed voltage from said external voltage to output onto said supply line;
a series resistor circuit having a plurality of trimming resistors connected serially via a plurality of connection points, the plurality of trimming resistors being provided between said supply line and ground potential;
a plurality of ON/OFF switches provided respectively in between said connection points and another input terminal of said differential amplifier; and
a shunt circuit having a shunt series resistor circuit of two shunt resistors serially connected via a middle point and two shunt ON/OFF switches respectively connected to opposite ends of said shunt series resistor circuit, said shunt circuit being connected in parallel with said series resistor circuit,
wherein said middle point is connected to one of said connection points of said series resistor circuit, the resistance ratio thereof with respect to said one of said connection points being equal to the resistance ratio of said shunt resistors.

2. A trimming circuit according to claim 1, further comprising:
a controller which drives said shunt ON/OFF switches to perform switching between on and off states according to an instruction command.

3. A trimming circuit according to claim 2, wherein the resistance of each said trimming resistor is greater than the resistance of each of said shunt resistors.

4. A trimming circuit according to claim 2, wherein said instruction command is a one-shot pulse signal, and when receiving said one-shot pulse signal, said controller drives said shunt ON/OFF to perform switching between on and off states.

5. A trimming circuit which trims a supplied external voltage to supply a trimmed voltage via a supply line, comprising:
a differential amplifier having a reference voltage inputted to one input terminal thereof and generating said trimmed voltage from said external voltage to output onto said supply line;
a series resistor circuit having first and second resistor groups of a plurality of resistors connected serially, said first and second resistor groups being serially connected between said supply line and ground potential;
a switch group of a plurality of ON/OFF switches connected between a predetermined number of connection points of the plurality of resistors of said first and second resistor groups and another input terminal of said differential amplifier;
a first shunt circuit having a first shunt switch and a first shunt resistor serially connected to said first shunt switch, said first shunt circuit being connected in parallel with said first resistor group; and
a second shunt circuit having a second shunt switch and a second shunt resistor serially connected to said second shunt switch, said second shunt circuit being connected in parallel with said second resistor group.

6. A trimming circuit according to claim 5, wherein a combined resistance of said first resistor group is larger than the resistance of said first shunt resistor.

7. A trimming circuit according to claim 5, wherein one ends of said first resistor group, said second resistor group, said first shunt circuit, and said second shunt circuit are connected in common.

8. A trimming circuit according to claim 5, wherein the resistance ratio of said first resistor group to said second resistor group is identical to the resistance ratio of said first shunt circuit to said second shunt circuit.

9. A trimming circuit according to claim 5, further comprising:
a controller which drives said first shunt switch and said second shunt switch to perform switching between on and off states in accordance with an instruction command.

10. A trimming circuit according to claim 5, wherein said controller drives, in response to said instruction command, said first shunt switch and said second shunt switch to be turned-on over a predetermined period of time.

11. A trimming circuit according to claim 10, wherein said predetermined period of time is determined in accordance with a charging time based on a circuit capacitance and a line resistance, the circuit capacitance being a capacitance of said differential amplifier and said series resistor circuit and the line resistance being a wiring resistance for said differential amplifier and said series resistor circuit.

* * * * *